United States Patent [19]
Cho et al.

[11] Patent Number: 5,946,242
[45] Date of Patent: Aug. 31, 1999

[54] INTERNAL SOURCE VOLTAGE GENERATOR FOR A SEMICONDUCTOR MEMORY DEVICE

[75] Inventors: Soo-In Cho; Sang-Jae Rhee, both of Seoul, Rep. of Korea

[73] Assignee: Samsung Electronics, Co., Ltd., Suwon, Rep. of Korea

[21] Appl. No.: 08/883,537

[22] Filed: Jun. 26, 1997

[30] Foreign Application Priority Data

Aug. 29, 1996 [KR] Rep. of Korea ................ 96/36480

[51] Int. Cl.$^6$ ........................................... G11C 7/00
[52] U.S. Cl. .................. 365/189.06; 365/226; 365/201
[58] Field of Search ................. 365/189.06, 189.09, 365/189.11, 201, 226

[56] References Cited

U.S. PATENT DOCUMENTS

| | | | |
|---|---|---|---|
| 5,063,304 | 11/1991 | Iyengar | 365/189.09 |
| 5,262,999 | 11/1993 | Etoh et al. | 365/226 |
| 5,283,762 | 2/1994 | Fujishima | 365/189.09 |
| 5,452,253 | 9/1995 | Choi | 365/201 |
| 5,659,503 | 8/1997 | Sudo et al. | 365/189.09 |

FOREIGN PATENT DOCUMENTS 93109368 12/1993 Japan.

*Primary Examiner*—Tan T. Nguyen
*Attorney, Agent, or Firm*—Marger Johnson McCollom, P.C.

[57] ABSTRACT

A circuit for generating an internal source voltage signal responsive to an external source voltage signal in a semiconductor memory device prevents malfunction and extends the lifetime of the device by clamping the internal source signal if the device is in a normal operating mode when the external source signal is in a stress operating range. When the device is placed in a test mode, the circuit allows the internal source signal to increase in proportion to the level of the external source signal when the external source signal is in a stress operating range. The circuit includes in internal source voltage generator, which always clamps the internal source signal when the external source signal is in a normal operating range, and a pull-up unit which is activated in response to a control signal. The control signal is enabled when the device is placed in a test mode by combining external timing signals.

18 Claims, 2 Drawing Sheets

INTERNAL SOURCE VOLTAGE GENERATOR FOR A SEMICONDUCTOR MEMORY DEVICE

This application corresponds to Korean patent application No. 36480/1996 filed Aug. 29, 1996 in the name of Samsung Electronics Co., Ltd., which is herein incorporated by reference for all purposes.

BACKGROUND OF THE INVENTION

1. Field of the Invention

This invention relates generally to semiconductor memory devices, and more particularly to an internal source voltage generator for a semiconductor memory device.

2. Description of the Related Art

A semiconductor memory device typically employs an internal source voltage generating circuit which generates an internal source voltage signal at a stable voltage level regardless of variations in an external source voltage signal. FIGS. 1–2 illustrate the structure and operation of a prior art internal source voltage signal generating circuit. Referring to FIG. 2, when the voltage of the external source voltage signal Vext is in a low voltage range between zero volts and Vno, the voltage of the internal source voltage signal Vint increases in proportion to the voltage of Vext. As Vext increases through a normal operation range (between Vno and Vsm), the circuit of FIG. 1 clamps the voltage of Vint at the level Vno and maintains it at that voltage level until Vext exceeds Vsm. When the voltage level of Vext increases beyond Vsm, the voltage of Vint increases as Vext increases.

The operation of the prior art internal source voltage signal generating circuit will now be explained in more detail with reference to FIG. 1. As the voltage of Vext increases from zero volts to Vno, which is the normal operating voltage, the voltage of Vint increases with, and remains equal to, the voltage of Vext. A boosted voltage signal VPP is generated by boosting the internal source voltage signal Vint. The signal VPP is applied to a word line coupled to a memory cell. The voltage level Vwl corresponds to the level of the voltage boosted by a threshold voltage Vt of an access transistor. When the voltage level of Vext enters the normal operating region, the level of the voltage Vwl is clamped by 2 Vt by means of PMOS transistors 105 and 106 and maintained at a fixed level. The voltage level of the boosted voltage signal VPP is maintained at a fixed difference from the voltage level of Vint.

When the voltage level of the external source voltage signal Vext enters a stress operating range, which is greater than Vsm, the voltage level of the signals Vint and VPP increase (with a fixed difference therebetween) as the voltage levels of Vext increases regardless of whether the memory device is in a normal operating mode or a stress operating mode.

To assure the reliability of a semiconductor chip when the external voltage signal Vext is in the stress operating range, a burn-in test for screening the chip must be performed when the chip is in a test mode. To perform such a test, an internal source voltage signal having a voltage higher than the normal operating voltage Vno must be applied to the interior of the semiconductor chip to apply enough stress for proper testing.

The two operating voltage ranges used in the interior of a semiconductor chip are the clamping range (from Vno to Vsm) and the stress range (above Vsm). The voltage of Vint is set internally by the circuit of FIG. 1 which operates to supply a stable voltage in the normal operation range as shown in FIG. 2. The voltage of Vint increases as the voltage of the external source voltage Vext increases in the stress operating range so as to stress the interior of the chip. The operating range of the internal source voltage signal Vint is determined by the voltage of the external source voltage signal Vext which is applied to the chip. I.e., when the voltage of Vext is in the normal range between Vno and Vsm, the voltage of Vint is maintained at a stable level of Vno, and when the voltage of Vext is increased to the stress operating range above Vsm, the voltage of Vint increases as the voltage of Vext increases.

In a memory cell structure which uses an NMOS transistor as the access transistor (for example, a typical DRAM structure) a boost voltage signal VPP is required in the interior of the semiconductor chip because the voltage of the word line as a gate node of the access transistor must be high enough to reciprocally transmit data between bit lines and storage nodes. The voltage of VPP is typically Vint plus 1 Vt. Because the voltage of the boost signal VPP is similar to that of Vint with the exception of the level difference, it too can be divided into a normal operation range and a stress operation range.

However, this creates a problem in that, as the voltage level of Vint increases in the stress operation range, the voltage level of VPP increases to the extent that it causes the chip to malfunction. Another disadvantage of the prior art is that, during a normal operation mode, if Vext increases into the stress operating range, the increased voltage of VPP can reduce the lifetime of the chip due to the stress applied directly to the memory cells.

Accordingly, a need remains for a technique for overcoming the disadvantages of the prior art.

SUMMARY OF THE INVENTION

Therefore, it is an object of the present invention to generate an internal source voltage signal for a semiconductor memory device in a manner which prevents malfunction of the memory device.

Another object of the present invention is to prolong the lifetime of a semiconductor device.

To accomplish these and other objects, an internal source voltage generating circuit constructed in accordance with the present invention varies the manner in which the internal source voltage signal is generated depending upon the operating mode, e.g., normal mode or stress mode, of a semiconductor device. A circuit constructed in accordance with the present invention further improves the lifetime and operation of a semiconductor device by entering a stress mode only in a burn-in test, and by utilizing separate control paths during a normal mode and a burn-in test mode.

An embodiment of a circuit constructed in accordance with the present invention generates an internal source voltage signal responsive to an external source voltage signal in a semiconductor memory device. The circuit prevents malfunction and extends the lifetime of the device by clamping the internal source signal if the device is in a normal operating mode when the external source signal is in a stress operating range. When the device is placed in a test mode, the circuit allows the internal source signal to increase in proportion to the level of the external source signal when the external source signal is in a stress operating range. The circuit includes in internal source voltage generator, which always clamps the internal source signal when the external source signal is in a normal operating range, and a pull-up unit which is activated in response to a control signal. The control signal is enabled when the device is placed in a test mode by combining external timing signals.

One aspect of the present invention is a method for generating an internal source signal for a semiconductor memory device comprising: generating the internal source signal responsive to an external source signal; clamping the internal source signal when the external source signal is in a normal operating range; and clamping the internal source signal when the external source signal is in a stress operating range and the memory device is in a normal mode. The method also includes maintaining the voltage of the internal source signal at a level commensurate with the voltage of the external source signal when the external source signal is in a stress operating range and the memory device is in a test mode. The method further includes maintaining the voltage of the internal source signal at a level commensurate with the voltage of the external source signal when the external source signal is in a low operating range.

Another aspect of the present invention is a circuit for generating an internal source signal for a semiconductor memory device comprising an internal source signal generator and a pull-up unit. The internal source signal generator has a first terminal for receiving an external source signal and a second terminal for transmitting the internal source signal responsive to the external source signal. The internal source signal generator clamps the internal source signal when the external source signal is in a normal operating range, and also when the external source signal is in a stress operating range and the memory device is in a normal mode. The pull-up unit has a first terminal for receiving the external source signal and a second terminal coupled to the second terminal of the internal source signal generator. The pull-up unit maintains the voltage of the internal source signal at a level commensurate with the voltage of the external source signal when the external source signal is in a stress operating range and the memory device is in a test mode.

An advantage of the present invention is that it improves the reliability of a semiconductor device.

Another advantage of the present invention is that it prevents malfunctions and prolongs the lifetime of a semiconductor device.

The foregoing and other objects, features and advantages of the invention will become more readily apparent from the following detailed description of a preferred embodiment of the invention which proceeds with reference to the accompanying drawings.

DETAILED DESCRIPTION

Figure 3:
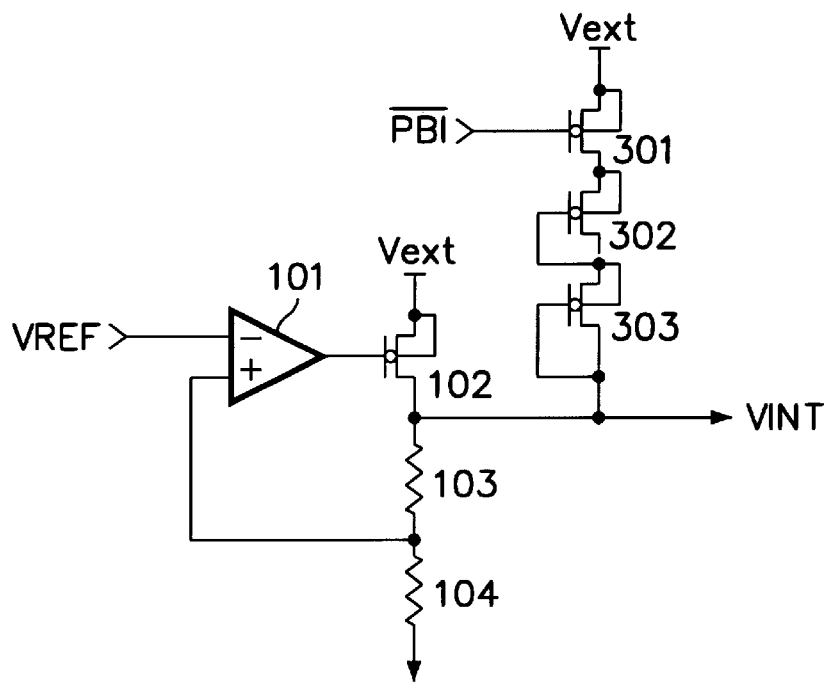
FIG. 3 is a schematic diagram of an embodiment of an internal source voltage signal generating circuit constructed in accordance with the present invention.

FIG. 3 is a schematic diagram of an embodiment of an internal source voltage signal generating circuit for a semiconductor device constructed in accordance with the present invention. The circuit of FIG. 3 includes an internal source voltage generator which includes a differential amplifier 101, a PMOS transistor 102 and two resistors 103 and 104 configured as a voltage divider. Transistor 102 includes a channel connected between an external voltage source Vext and an output node for transmitting the internal source voltage signal Vint. The amplifier 101 includes an inverting input terminal for receiving a reference voltage signal VREF, a non-inverting input terminal, and an output terminal connected to the gate of transistor 102. Resistor 103 is connected between the output node of the internal source signal generator and the non-inverting input terminal of amplifier 101, while resistor 104 is connected between the non-inverting input terminal of amplifier 101 and a power source ground terminal.

The circuit of FIG. 3 also includes a pull-up unit including three PMOS transistors 301, 302, and 303. The channels of transistors 301, 302 and 303 are connected in series between the external source Vext and the output terminal of the internal source signal generator. The gates of transistors 302 and 303 are connected back to their respective channels in a diode connected manner. The gate of transistor 301 is coupled to receive a control signal /PBI.

In operation, the voltage divider formed from resistors 103 and 104 divide the voltage level of the internal source voltage signal Vint thereby generating a feedback signal at the non-inverting input terminal of amplifier 101. The voltage of Vint is reduced by a threshold voltage Vt of PMOS transistor 102.

Figure 1:
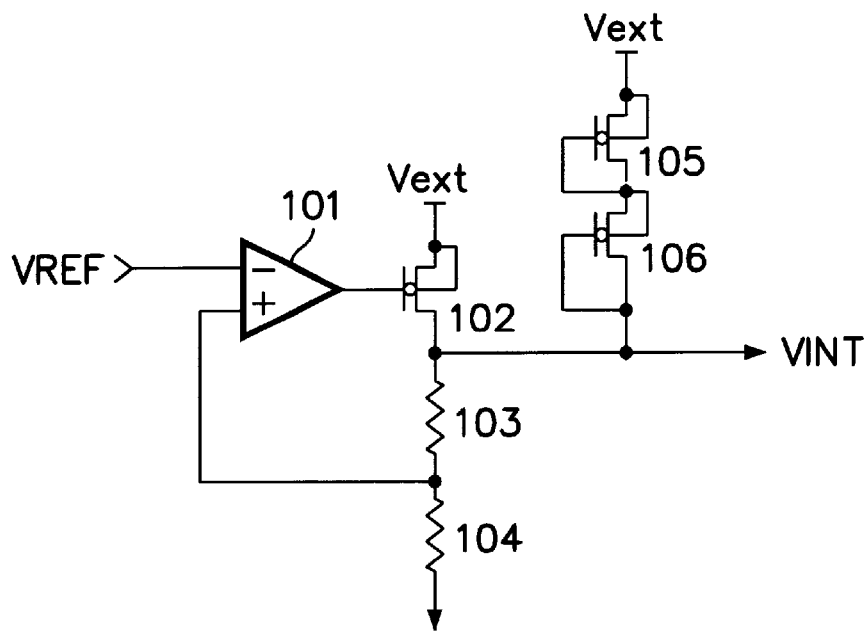
FIG. 1 is a schematic diagram of a prior art internal source voltage generating circuit.
Figure 2:
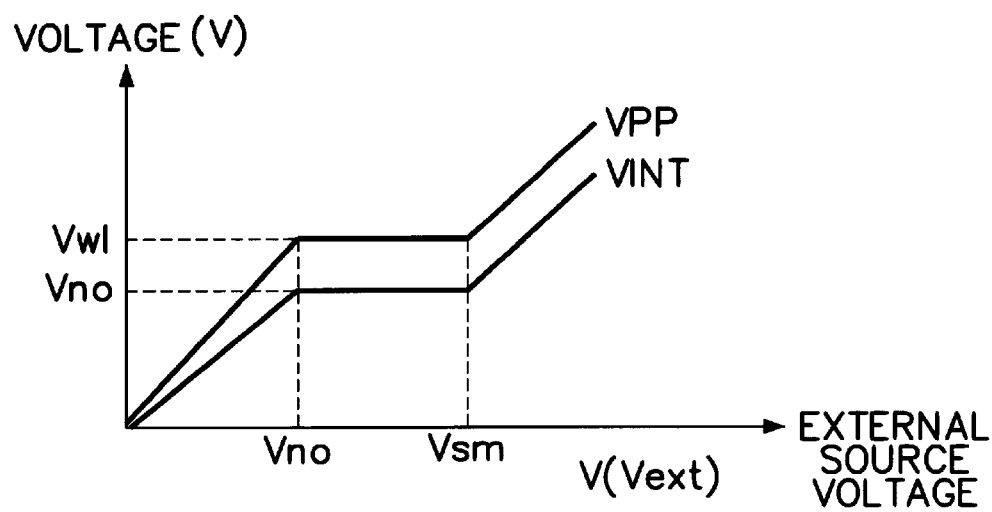
FIG. 2 is a waveform diagram illustrating the operation of the circuit of FIG. 1.

The operation of the circuit of FIG. 3 will now be described in more detail with reference to FIGS. 3 and 4. The internal source voltage signal Vint is generated in response to the voltage level of the external source voltage signal Vext in a low voltage operating range (when Vext is between zeroV and Vno), a normal operating range (Vext between Vno and Vsm), and a stress operating range (Vext greater than Vsm). In the low operating range and the normal operating range, the operation of the circuit of FIG. 3 is similar to the operation of the prior art circuit of FIG. 1. That is, in the low operating range, Vint increases as Vext increases, while in the normal operating range, Vint is maintained at a fixed voltage level by clamping Vint. However, in the stress operating range, the circuit of FIG. 3 maintains the voltage of Vint at a different level depending on whether the semiconductor device is in a normal operating mode or a stress operating mode.

In the normal mode, the control signal /PBI is disabled (e.g., at a high logic level). Thus, transistor 301 of the pull-up unit turns off, and even though the voltage of Vext rises into the stress range, the voltage of Vint is maintained by clamping it at Vno. In the stress mode, the control signal /PBI is enabled for a burn-in test. This turns on transistor 301 which causes the voltage of Vint to increase as the voltage of Vext increases. A voltage difference of 2 Vt or more is maintained between Vext and Vint.

The boost voltage signal VPP is generated from Vint in the same manner as in the prior art.

The control signal /PBI is generated in response to external timing signals. For example, /PBI can be generated by combining WCBR specific timing for test only mode with a specific signal generated when a high voltage (for example, Vint plus ΔV) is applied to a specific pin.

Figure 4:
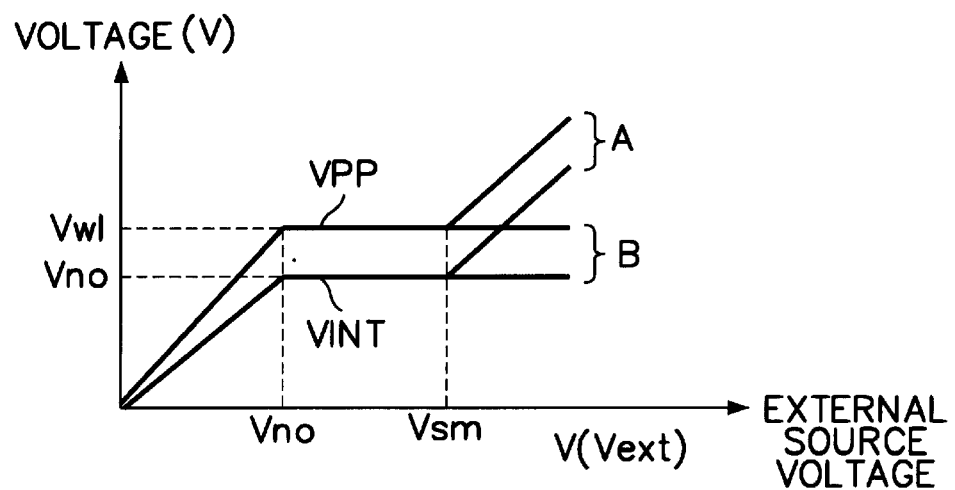
FIG. 4 is a waveform diagram illustrating the operation of the circuit of FIG. 3.

As shown in FIG. 4, after the signal Vext rises out of the normal range (from Vno to Vsm) the waveforms of the signals Vint and VPP are divided into pair A, where Vint and VPP increase in accordance with increases in Vext in a stress operating mode, and pair B, where VPP and Vint are maintained at constant voltage levels regardless of changes in the voltage of Vext in a normal operating mode.

Thus, by applying a stress level voltage to the interior of a semiconductor chip only in a stress mode during a burn-in test, the circuit of FIG. 3 reduces malfunctions and increases the lifetime of a semiconductor chip.

Having described and illustrated the principles of the invention in a preferred embodiment thereof, it should be apparent that the invention can be modified in arrangement and detail without departing from such principles.

We claim all modifications and variations coming within the spirit and scope of the following claims:

1. A method for generating an internal source signal for a semiconductor memory device comprising:
    generating the internal source signal responsive to an external source signal;
    clamping the internal source signal when the external source signal is in a normal operating range; and
    clamping the internal source signal when the external source signal is in a stress operating range and the memory device is in a normal mode.

2. A method according to claim 1 further including maintaining the voltage of the internal source signal at a level commensurate with the voltage of the external source signal when the external source signal is in a stress operating range and the memory device is in a test mode.

3. A method according to claim 2 wherein the voltage of the internal source signal is maintained at a level commensurate with the voltage of the external source signal responsive to a control signal.

4. A method according to claim 3 further including generating the control signal responsive to external timing signals.

5. A method according to claim 1 further including maintaining the voltage of the internal source signal at a level commensurate with the voltage of the external source signal when the external source signal is in a low operating range.

6. A method according to claim 1 further including generating a boost signal responsive to the internal source signal.

7. A method according to claim 1 wherein the internal source signal is clamped responsive to a control signal.

8. A circuit for generating an internal source signal for a semiconductor memory device comprising:
    an internal source signal generator having a first terminal for receiving an external source signal and a second terminal for transmitting the internal source signal responsive to the external source signal, the internal source signal generator clamping the internal source signal when the external source signal is in a normal operating range, and when the external source signal is in a stress operating range and the memory device is in a normal mode; and
    a pull-up unit having a first terminal for receiving the external source signal and a second terminal coupled to the second terminal of the internal source signal generator, the pull-up unit maintaining the voltage of the internal source signal at a level commensurate with the voltage of the external source signal when the external source signal is in a stress operating range and the memory device is in a test mode.

9. A circuit according to claim 8 wherein the pull-up unit operates responsive to a control signal.

10. A circuit according to claim 8 wherein the internal source signal generator includes an amplifier having a first input terminal for receiving a reference signal, a second input terminal for receiving a feedback signal, and an output terminal for transmitting the internal source signal.

11. A circuit according to claim 10 wherein the internal source signal generator further includes a voltage divider coupled between the output terminal and the second input terminal of the internal source signal generator for generating the feedback signal responsive to the internal source signal.

12. A circuit according to claim 10 wherein the internal source signal generator further includes a transistor having a first terminal coupled to the output terminal of the amplifier, a second terminal coupled to the second terminal of the internal source signal generator, and a third for receiving the external source signal.

13. A circuit according to claim 10 wherein the pull-up unit includes:
    a first transistor having a first terminal for receiving the external source signal, a second terminal for receiving a control signal, and a third terminal; and
    a first diode connected transistor coupled between the third terminal of the first transistor and the second terminal of the pull-up unit.

14. A circuit according to claim 13 wherein the pull-up unit further includes a second diode connected transistor coupled between the first diode connected transistor and the second terminal of the pull-up unit.

15. A circuit for generating an internal source signal for a semiconductor memory device comprising:
    means for generating the internal source signal responsive to an external source signal; and
    means for pulling up the internal source signal when the external source signal is in a stress operating range;
    wherein:
    the means for generating includes:
        an output node,
        an amplifier having a first input terminal for receiving a reference signal, a second input terminal for receiving a feedback signal, and an output terminal,
        a first transistor having a channel coupled between a first external source terminal and the output node and a gate coupled to the output terminal of the amplifier,
        a first resistor coupled between the output node and the second input terminal of the amplifier, and
        a second resistor coupled between the second input terminal of the amplifier and a second external source terminal; and
    the means for pulling up includes:
        a second transistor having a channel and a gate,
        a third transistor having a channel and a gate, and
        a fourth transistor having a channel and a gate,
        wherein the channels of the second, third and fourth transistors are coupled in series between the first external source terminal and the output node, the gate of the second transistor is couple to receive a control signal, and the gates of the third and fourth transistors are diode connected.

16. A method for generating an internal source signal for a semiconductor memory device comprising:
    a first step for generating the internal source signal when an external source signal is in a first operating range;
    a second step for generating the same internal source signal when the external source signal is in a second operating range; and
    a third step for generating the same internal source signal when the external source signal is in a third operating range;
    wherein the first step includes maintaining the voltage of the internal source signal at a level commensurate with the voltage of the external source signal.

17. A method for generating an internal source signal for a semiconductor memory device comprising:
- a first step for generating the internal source signal when an external source signal is in a first operating range;
- a second step for generating the same internal source signal when the external source signal is in a second operating range; and
- a third step for generating the same internal source signal when the external source signal is in a third operating range;
- wherein the second step includes clamping the internal source signal.

18. A method for generating an internal source signal for a semiconductor memory device comprising:
- a first step for generating the internal source signal when an external source signal is in a first operating range;
- a second step for generating the same internal source signal when the external source signal is in a second operating range; and
- a third step for generating the same internal source signal when the external source signal is in a third operating range;
- wherein the third step includes:
- clamping the internal source signal responsive to the mode of the memory device; and
- maintaining the internal source signal at a level commensurate with the external source signal responsive to the mode of the memory device.

* * * * *